United States Patent [19]
Blees et al.

[11] Patent Number: 6,027,862
[45] Date of Patent: Feb. 22, 2000

[54] METHOD OF APPLYING A SILVER LAYER TO A GLASS SUBSTRATE

[75] Inventors: Martin H. Blees; Antonius A. M. Van Weert, both of Eindhoven, Netherlands

[73] Assignee: U.S. Philips Corporation, New York, N.Y.

[21] Appl. No.: 08/972,974

[22] Filed: Nov. 19, 1997

[30] Foreign Application Priority Data

Nov. 21, 1996 [EP] European Pat. Off. ............. 96203270

[51] Int. Cl.$^7$ ............................... C03C 17/00; G03F 7/00
[52] U.S. Cl. ..................... 430/318; 430/319; 205/163; 205/187; 205/210; 205/263
[58] Field of Search .................... 430/318, 322, 430/323, 319; 205/163, 187, 210, 263

[56] References Cited

U.S. PATENT DOCUMENTS

| | | | |
|---|---|---|---|
| 2,504,272 | 4/1950 | McCoy | 205/263 |
| 3,406,107 | 10/1968 | Grebe et al. | 205/263 |
| 3,819,497 | 6/1974 | Grunwald et al. | 427/98 |
| 3,960,564 | 6/1976 | Molenaar et al. | 96/48 |

FOREIGN PATENT DOCUMENTS

| | | |
|---|---|---|
| 0577187B1 | 12/1995 | European Pat. Off. . |
| WO9527924 | 10/1995 | WIPO . |

OTHER PUBLICATIONS

"Electroplating of Plastics of theory and practice", by Ing. Josef Christoph et al, Finishing Publications Ltd., Hampton Hill, GB, pp. 8–9.

*Primary Examiner*—John A. McPherson
*Attorney, Agent, or Firm*—Robert J. Kraus

[57] ABSTRACT

A description is given of a method of providing an adhesive silver layer on a glass substrate, in which method the glass surface is activated, whereafter a first silver layer is provided from an electroless silver bath and reinforced by means of a second silver layer which is electrodeposited thereon from a cyanide-free bath comprising ammonia as the complexing agent for silver ions. The method can very suitably be used for silver-plating glass plates, as used in thin gas-discharge displays or thin electron displays, for example selection plates or control plates.

5 Claims, No Drawings

METHOD OF APPLYING A SILVER LAYER TO A GLASS SUBSTRATE

BACKGROUND OF THE INVENTION

The invention relates to a method of applying a silver layer to a glass substrate, which silver layer comprises a first and a second silver layer, in which method the substrate is provided, after it has been activated, with the first silver layer from an electroless silver bath, whereafter the first silver layer is provided with the second silver layer by means of an electroplating process.

Examples of glass substrates are, in particular, glass plates for use in plasma displays, cathode-ray displays, field-emission displays and thin electron displays in which holes are formed to transport electrons. Said glass plates may be constructed as plates and provided with addressable electrodes of silver. Silver is preferred because it has the highest electric conductivity of all metals. This is necessary because of the small line widths of the electrode patterns of, typically, 100 $\mu$m and thicknesses of approximately 2 $\mu$m.

Such a method is disclosed, inter alia, in "Electroplating of Plastics, Handbook of theory and practice, Finishing Publications Ltd., Hampton Hill, GB, pp. 8–9. Said handbook states that, for example, glass can be provided with a silver layer by means of a wet-chemical process, which silver layer is obtained by chemical reduction. Owing to the low deposition rate of electroless baths, the thin silver layer is subsequently reinforced with a thicker second silver layer which is formed by electrolysis (electroplating). As described in said handbook, there is a risk that in the case of relatively thick silver layers, the internal stresses in the silver layer increase to such an extent that the silver layer and the substrate become detached. The adhesion between the silver layer and a glass substrate can be improved by mechanically roughening the substrate by means of powder blasting with, for example, aluminium-oxide particles. The resultant hair cracks in the glass surface are subsequently etched selectively with, in succession, an aqueous HF and $HNO_3$ solution, which results in deeper hair cracks. The silver layer to be provided is mechanically anchored to the substrate surface and hence adheres well thereto.

The above-described method has a number of drawbacks. Powder blasting results in a quantity of arsenical chemical waste, which originates from the (borosilicate) glasses used. After use, the HF solutions employed form hazardous chemical waste. The mechanical strength of the glass plates having a typical thickness of only 0.4 mm is reduced considerably. Moreover, three additional process steps (powder blasting, HF-etching and $HNO_3$-etching) are necessary to make the silver adhere properly.

SUMMARY OF THE INVENTION

It is an object of the invention to provide, inter alia, a reliable method of applying a properly adhering silver layer to a glass substrate, in which the customary powder-blasting and etching steps are avoided. The silver layer must adhere well to a smooth glass substrate, in particular a glass plate. In addition, the silver layer must be resistant to temperatures up to 450° C. on account of subsequent process steps which are necessary to manufacture a display, namely resist stripping and fritting of the glass plates. In addition, the method should not require the use of expensive vacuum equipment.

These objects are achieved by a method as described in the opening paragraph, which is characterized in accordance with the invention in that the second silver layer is applied from a cyanide-free electrosilvering bath in which silver ions are complexed with ammonia.

Experiments carried out by the Applicant have shown that the first silver layer, which is obtained from an electroless silver bath, does not lead to problems regarding adhesion. Said problems do not occur until the first silver layer is brought into contact with a customary electrosilvering bath on the basis of altaline silver cyanide ($KAg(CN)_2$/KCN). Such electrosilvering baths are commercially available and can yield a lustrous mirror layer. If the first silver layer is brought into contact with such an electrosilvering bath, said silver layer becomes cracked, so that the silver layer can be rinsed from the glass plate by means of water. This effect does not occur if the glass plates are roughened in the manner described hereinabove.

Surprisingly, it has been found that delamination of the first silver layer does not occur if, for the second layer, an electrosilvering bath is used in which the silver ions are complexed with ammonia instead of cyanide ions. Such a cyanide-free electrosilvering bath is composed, for example, of $AgNO_3$, $Na_3PO_4$, ammonia and water, which leads to the formation of $Ag(NH_3)_2^+$ ions. A large quantity of $Na_3PO_4$ provides for a good electric conductivity. To improve the stability of the bath, preferably, $H_3PO_4$ is added until a pH-value of 10–11 is achieved. The first silver layer serves as the cathode and is connected to the negative pole of a DC source. For the anode use is made of one or more silver plates. The current density used is, for example, 0.1–1 $A/dm^2$. The silver layer formed has a dull-white appearance instead of a mirror-like appearance; however, this is not disadvantageous to the intended application. For the intended application, the second silver layer has a layer thickness in the range from 1 to 2 $\mu$m. It has been found, however, that up to 30 $\mu$m thick silver layers applied by means of the method in accordance with the invention adhere well to smooth glass surfaces.

To apply the first silver layer, use is made of a customary electroless silver bath on the basis of an ammoniacal silver solution and a reduction agent, such as sucrose, formaline, hydrazine or K,Na-tartrate. A suitable electroless silver bath is described in example 6 of U.S. Pat. No. 3,960,564, in the name of the current Applicant. The layer thickness of the first silver layer is, for example, 100–300 nm. The deposition rate of the silver layer in such a bath is approximately 300 nm/hour at 25° C.

To provide the first silver layer, the surface of the glass substrate must be activated. This can be achieved by treating the glass surface with an aqueous solution of an aminoalkyl trialkoxysilane and, subsequently, immersing it in an aqueous Pd-sol stabilized with polyvinyl pyrrolidone (PVP). Such an activation method is described in European Patent EP-B-577187, in the name of the current Applicant.

Preferably, the glass surface is activated with an aqueous solution of $SnCl_2$/HCl. The concentrations of the chemicals used are not critical. A typical activation bath comprises 5 g/l of $SnCl_2.2H_2O$ and 0.37 wt. % of HCl. The advantage of this activation method is that it can be carried out in one step instead of two. In addition, the chemicals used are cheaper.

The advantage of an $SnCl_2$/HCl activation manifests itself, in particular, after a thermal treatment at 160–250° C. This thermal treatment can be carried out after the provision of the first (electroless) silver layer or after the provision of the second (electrodeposited) silver layer. After a thermal treatment, the adhesion of the silver layer is much better than that of a silver layer whose glass surface has been activated with Pd/PVP. The pull strength of a silver layer after activation with Pd/PVP is found to be independent of the temperature of the thermal treatment and amounts to 15

MPa. The pull strength of an (electroless) silver layer whose glass surface is pretreated with $SnCl_2/HCl$ is 9 MPa. A thermal treatment of the silver layer at 160° C. and 250° C. results in an improved pull strength, respectively, of 28 and 44 MPa. In the latter case, fracture occurs in the glass instead of along the glass/silver inter-face.

The method in accordance with the invention can be used, in particular, to manufacture selection plates and control plates in thin displays. An alternative method of manufacturing a selection plate for a thin electron display is described in the international Patent Application WO-A-95/27924, in the name of the current Applicant. The glass selection plates have a thickness of 0.4 mm and are provided with a hole pattern, for example, of 400,000 holes having a diameter of 400 $\mu$m. Metal selection electrodes, which can be individually driven by means of narrow metal tracks on the glass plate, are provided in and around said holes. For the metal use is made of a stack of Cr/Al/Cr which is provided by sputtering or vapor deposition. Said metal stack is structured photolithographically, using a cataphoretic negative photoresist lacquer. In accordance with the invention, the Cr/Al/Cr stack is replaced by a silver layer comprising a first silver layer provided in an electroless process and a second electrodeposited silver layer provided from a cyanide-free bath with ammonia as the complexing agent for silver.

The silver layer can be provided with a desired electrode pattern by subjecting it to a wet-chemical etching process using, for example, aqueous solutions of $Fe(NO_3)_3$, $HNO_3$, $Ce(NH_4)_2NO_3)_6$, $NH_4NO_3$ and $KI/I_2$. The advantage of the method in accordance with the invention is that it does not require expensive vacuum equipment, i.e. aluminium cannot be deposited from an aqueous solution. In addition, the electric conductivity of silver is better than that of other metals.

To manufacture a silver pattern, use can be made of the customary cataphoretic or non-cataphoretic photoresists.

DESCRIPTION OF THE PREFERRED EMBODIMENTS

These and other aspects of the invention will be apparent from and elucidated with reference to the embodiments described hereinafter.

EXAMPLE 1

A smooth glass plate (type Corning 7059 borosilicate glass) having a thickness of 0.4 mm is cleaned by rinsing it with, in succession, deionized water, ethanol and heptane. After blow drying with nitrogen, the glass plate is subjected to a treatment in an UV/ozone reactor for 15 minutes. Subsequently, the glass plate is activated by immersing it, for 3 minutes, in an aqueous solution of 5 g/l $SnCl_2.2H_2O$ and 0.37 wt. % HCl at room temperature.

After rinsing with water, the activated glass plate is subjected to an electroless silver-plating process in a bath obtained by mixing the following constituents:

750 ml of an aqueous solution of 10 g/l $AgNO_3$. Ammonia is added to said aqueous solution until a clear solution is obtained.

250 ml of an aqueous solution of 2 wt. % Na,K-tartrate.

10 ml of an aqueous solution of 25 wt. % Triton QS 15 (a surface-active substance).

20 ml of an aqueous solution of 0.02 wt. % phenyl mercaptotetrazole.

The composition of this bath corresponds to that mentioned in U.S. Pat. No. 3,960,564, in the name of the current Applicant.

The silver-plating process is carried out at room temperature for 30 minutes. The layer thickness of the resultant first silver layer is 150 nm. The substrate thus formed is rinsed with water.

To reinforce the first silver layer, the substrate is subsequently introduced into an electrosilvering bath at room temperature, the composition of said bath being:

150 g $Na_3PO_4.12H_2O$ 24 g $AgNO_3$ 84 ml ammonia (25 wt. %)

1000 ml deionized water $H_3PO_4$ (85 wt. %) until pH=10–11.

The silver layer on the substrate is connected to the negative pole of a direct-current source. The positive pole is connected to two silver electrodes situated on either side of the substrate.

The current density is 0.05 $A/dm^2$ for 30 seconds. Subsequently, the current density is increased to 0.13 $A/dm^2$ for 30 seconds, whereafter the current density is set at 0.45 $A/dm^2$. The layer thickness of the electrodeposited silver layer is 2 $\mu$m; the overall layer thickness of the silver coating is 2.15 $\mu$m.

The pull strength is measured by means of a DPO (Direct Pull-Off) measurement. To this end, the head of an aluminium stud is glued onto the silver layer by means of a two-component epoxy adhesive. Subsequently, the stud is used to exert a pull force at right angles to the silver layer. The force at which fracture occurs is determined and serves as a measure for the pull strength. The pull strength of the silver layer in accordance, with the invention is 9 MPa. Fracture occurs along the glass/silver layer interface. The silver layer can withstand a thermal treatment at 450° C. for 1 hour without the adhesion or the quality of the silver layer being adversely affected.

EXAMPLE 2

Example 1 is repeated, and after the provision of the first silver layer, the substrate is subjected to a number of thermal treatments in air. The results of the DPO measurements are listed in the Table. The place of fracture is also indicated in the third column of said Table.

TABLE

| thermal treatment | pull strength (MPa) | place of fracture |
| --- | --- | --- |
| 60° C. (20 hours) | 9 ± 3 | glass/silver |
| 160° C. (1 hour) | 28 ± 5 | glass/silver |
| 250° C. (0.5 hour) | 44 ± 7 | glass |

The Table further shows that the pull strength of the silver layer is improved substantially after a thermal treatment at 160–250° C. This effect does not occur after an activation with Pd/PVP.

It has been found that the provision of a second (electrodeposited) silver layer does not have any influence on the measuring results.

Comparative Example (not in accordance with the invention)

Example 1 is repeated up to and including the provision of the electroless silver layer. The substrate with the silver layer is introduced into an electrosilvering bath having the following composition:

50 g $KAg(CN)_2$
60 g $KCN$
15 g $K_2CO_3$
deionized water up to a total volume of 1000 ml.

After a residence time of several seconds in the electroplating bath, the silver layer provided in an electroless process is subject to crack formation. The silver layer can subsequently be removed entirely from the substrate by means of water: the pull strength is 0 MPa.

The method in accordance with the invention enables properly adhering silver layers to be formed on smooth glass substrates, in particular (sheet) glass plates, by means of a wet-chemical process. The resultant silver layers can withstand temperatures up to at least 450° C. without becoming detached from the glass surface.

We claim:

1. A method of applying a silver layer to a glass substrate, which silver layer comprises a first and a second layer, in which method the substrate is provided, after it has been activated with a hydrochloric solution of $SnCl_2$, with the first silver layer from an electroless silver bath, whereafter the first layer is provided with the second silver layer by means of an electroplating process from a cyanide-free electrosilvering bath in which silver ions are complexed with ammonia, characterized in that the silver layer is subjected to a temperature treatment at about 160–450° C. after the first silver layer is provided and either before or after the second silver layer is provided.

2. A method as claimed in claim 1, characterized in that an aqueous solution of $AgNO_3$, $Na_3PO_4$ and ammonia is used as the electrosilvering bath.

3. A method of manufacturing a selection or control plate for a thin display, comprising the steps of:

forming a glass plate having a number of holes arranged in accordance with a pattern;

activating the glass plate;

forming a first silver layer on the glass plate from an electroless silver bath; and electroplating a second silver layer on the first silver layer from a cyanide-free electrosilvering bath in which silver ions are complexed with ammonia.

4. A method of manufacturing a selection or control plate for a thin display, comprising the steps of:

applying a silver layer to a glass substrate, which silver layer comprises a first and a second layer, in which method the substrate is provided, after it has been activated, with the first silver layer from an electroless silver bath, whereafter the first layer is provided with the second silver layer by means of an electroplating process, characterized in that the second silver layer is provided from a cyanide-free electrosilvering bath in which silver ions are complexed with ammonia; and photolithographically structuring the silver layer so as to form a silver pattern on the glass substrate.

5. A method of applying a dull-white silver layer to a glass substrate, which silver layer comprises a first and a second layer, in which method the substrate is provided, after it has been activated, with the first silver layer from an electroless silver bath, whereafter the first layer is provided with the second silver layer by means of an electroplating process, characterized in that the second silver layer is provided from a cyanide-free electrosilvering bath at a PH of 10–11 in which silver ions are complexed with ammonia.

* * * * *